US010263083B2

(12) United States Patent
Cho

(10) Patent No.: US 10,263,083 B2
(45) Date of Patent: Apr. 16, 2019

(54) THIN FILM TRANSISTOR ARRAY SUBSTRATE AND DISPLAY PANEL THEREOF

(71) Applicants: HKC Corporation Limited, Shenzhen, Guangdong (CN); Chongqing HKC Optoelectronics Technology Co., Limited, Chongqing (CN)

(72) Inventor: En-Tsung Cho, Chongqing (CN)

(73) Assignees: HKC CORPORATION LIMITED, Shenzhen, Guangdong (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 0 days.

(21) Appl. No.: 15/578,539

(22) PCT Filed: Sep. 18, 2017

(86) PCT No.: PCT/CN2017/102011
§ 371 (c)(1),
(2) Date: Nov. 30, 2017

(65) Prior Publication Data
US 2019/0067422 A1 Feb. 28, 2019

(30) Foreign Application Priority Data
Aug. 25, 2017 (CN) .......................... 2017 1 0744122

(51) Int. Cl.
*H01L 29/167* (2006.01)
*H01L 27/12* (2006.01)
(Continued)

(52) U.S. Cl.
CPC .......... *H01L 29/167* (2013.01); *H01L 27/127* (2013.01); *H01L 27/1222* (2013.01);
(Continued)

(58) Field of Classification Search
CPC ............. H01L 29/167; H01L 29/78684; H01L 27/1222; H01L 29/04; H01L 29/66742;
(Continued)

(56) References Cited

U.S. PATENT DOCUMENTS

2012/0248452 A1* 10/2012 Yeo ........................ G06F 3/0412
257/60

* cited by examiner

*Primary Examiner* — Selim U Ahmed
(74) *Attorney, Agent, or Firm* — Juan Carlos A. Marquez; Marquez IP Law Office, PLLC

(57) ABSTRACT

A thin film transistor array substrate comprises: a substrate, a plurality of thin film transistors disposed on the substrate, wherein each of the plurality of thin film transistors comprises: a gate electrode structure, an isolate protective layer disposed on the gate electrode structure, an active layer disposed on the isolate protective layer, a source electrode layer disposed on a side of the active layer and forming an ohmic contact with the active layer, a drain electrode layer disposed on other side of the active layer and forming an ohmic contact with the active layer, a first concentration doping layer disposed on the active layer and between the source electrode layer and the drain electrode layer, a passivation layer covered onto the active layer, the source electrode layer and the drain electrode layer, and a pixel electrode layer covered onto the passivation layer and the drain electrode layer.

20 Claims, 5 Drawing Sheets

(51) Int. Cl.
*H01L 29/04* (2006.01)
*H01L 29/66* (2006.01)
*H01L 29/786* (2006.01)
*H01L 29/161* (2006.01)

(52) U.S. Cl.
CPC .......... *H01L 27/1288* (2013.01); *H01L 29/04* (2013.01); *H01L 29/161* (2013.01); *H01L 29/66742* (2013.01); *H01L 29/78609* (2013.01); *H01L 29/78618* (2013.01); *H01L 29/78684* (2013.01); *H01L 29/78696* (2013.01)

(58) Field of Classification Search
CPC ........... H01L 27/1288; H01L 29/78618; H01L 29/78696; H01L 27/127; H01L 29/161; H01L 29/78609
See application file for complete search history.

THIN FILM TRANSISTOR ARRAY SUBSTRATE AND DISPLAY PANEL THEREOF

FIELD OF THE INVENTION

The present invention relates to a thin film transistor array substrate and a display panel including the thin film transistor array substrate, in particular, a thin film transistor array substrate utilizing nanocrystalline silicon germanium oxide (NC-SixGeyOz) as doping material implanted into an active layer of the thin film transistor and a display panel using the thin film transistor at least in a pixel portion.

BACKGROUND OF THE INVENTION

The thin film transistor (TFT) is formed on the thin film transistor array substrate and is used for controlling the image displaying of the display panel, so that the thin film transistor is an indispensable main component in the liquid crystal display panel.

The thin film transistor array substrate also disposed with a source electrode layer, a drain electrode layer, gate electrode layer and an active layer. In one thin film transistor, when the current on the source electrode layer in the left side flowing to the drain electrode layer in the right side, a channel of the active layer formed in the middle of the active layer is required to penetrate through. Thereby, when the driving voltage is applied to the gate electrode layer under the active layer, an induced electric field is generated from the active layer and controlled the channel of the active layer to be turned on, then the current of the source electrode layer can be circulated to the drain electrode layer. This is the working principle of the thin film transistor array substrate.

The aforementioned thin film transistor array substrate is manufactured on a glass substrate, such manufacturing technique usually employing equipment like physical vapor deposition (PVD), chemical vapor deposition (CVD), other semiconductor process equipment, or the like. Furthermore, the passivation layer of the thin film transistor array substrate may be formed using a method such as plasma enhanced chemical vapor deposition (PECVD). As a switching element in a display device, an amorphous silicon layer or a polycrystalline silicon layer is used for an active layer of a thin film transistor is widely used. Using an amorphous silicon layer to form an active layer of a thin film transistor has problems such as low carrier mobility (less than 1 cm2/V·s) and small on-current. On the other hand, using a polycrystalline silicon layer to form an active layer of a thin film transistor has a problem in that, whereas the carrier mobility is too high (can be 200 cm2/V·s), and thus sufficient switching characteristics of the thin film transistor array substrate cannot be obtained. This problem is subject to process technology to overcome.

SUMMARY OF THE INVENTION

In order to solve the above-mentioned problems, it is an object of the present invention to provide a thin film transistor array substrate comprising: a substrate; a plurality of thin film transistors disposed on the substrate, wherein each of the plurality of thin film transistors comprises: a gate electrode structure; an isolate protective layer disposed on the gate electrode structure; an active layer disposed on the isolate protective layer, wherein the active layer is doped with a silicon-germanium oxide having the nanocrystalline size in a range of 1 nanometer to 20 nanometers; a source electrode layer disposed on a side of the active layer and forming an ohmic contact with the active layer; a drain electrode layer, disposed on other side of the active layer and forming an ohmic contact with the active layer; a first concentration doping layer disposed on the active layer and between the source electrode layer and the drain electrode layer; a passivation layer covered onto the active layer the source electrode layer and the drain electrode layer; and a pixel electrode layer covered onto the passivation layer and the drain electrode layer.

In one embodiment of the present invention, further comprising a second concentration doping layer disposed between the first concentration doping layer and the active layer, wherein a concentration of the first concentration doping layer is greater than a concentration of the second concentration doping layer.

Another object of the present invention is to provide a thin film transistor array substrate, comprising: a substrate; a plurality of thin film transistors disposed on the substrate, wherein each of the plurality of thin film transistors comprises: a gate electrode structure; an isolate protective layer disposed on the gate electrode structure; an active layer disposed on the isolate protective layer, wherein the active layer is doped with a silicon-germanium oxide; a source electrode layer disposed on a side of the active layer and forming an ohmic contact with the active layer; a drain electrode layer disposed on other side of the active layer and forming an ohmic contact with the active layer; a plurality of doping layers disposed on the active layer and between the source electrode layer and the drain electrode layer; a passivation layer covered the isolate protective layer, the source electrode layer and the drain electrode layer; and a pixel electrode layer covered onto the passivation layer and the drain electrode layer; wherein, each of the plurality of the doping layers comprises a first concentration doping layer and a second concentration doping layer, and polarities of the adjacent doping layers are different; wherein, the active layer is disposed among the isolate protective layer, the passivation layer, the source electrode layer, and the drain electrode layer.

In one embodiment of the present invention, the silicon-germanium oxide is composed of the nanocrystalline size in a range of 1 nanometer to 20 nanometers.

In one embodiment of the present invention, the plurality of doping layers are a two doping layers structure or three doping layers structure.

In one embodiment of the present invention, each of the plurality of doping layers comprises a stacked structure of the first concentration doping layer, the second concentration doping layer and the first concentration doping layer, wherein a concentration of the first concentration doping layer is greater than a concentration of the second concentration layer.

In one embodiment of the present invention, each of the plurality of doping layers comprises a stacked structure of the second concentration doping layer, the first concentration doping layer and the second concentration doping layer, wherein a concentration of the first concentration doping layer is greater than a concentration of the second concentration layer.

In one embodiment of the present invention, each of the plurality of doping layers comprises a stacked structure of the first concentration doping layer and the second concentration doping layer, wherein a concentration of the first concentration doping layer is greater than a concentration of the second concentration layer.

In one embodiment of the present invention, the left and right sides of the upper surface of the active layer is doping with phosphorus (P), arsenic (As) or antimony (Sb) to form high concentration N-type semiconductors.

In one embodiment of the present invention, the material of the passivation layer is silicon nitride or silicon oxide.

Another object of the present invention is to provide a display panel, comprising: a color filter substrate, and a thin film transistor array substrate selected from one of the aforementioned embodiments.

According to the aforementioned embodiments, the thin film transistor array substrate having a plurality of the nanocrystalline silicon germanium oxide (NC-SixGeyOz) doped into the surface of the active layer, so that the carrier mobility of the active layer can be effectively improved. In addition, by doping the lower concentration of the second concentration doping layer into the thin film transistor such that the leakage current of the thin film transistor array substrate is effective reduced. Therefore, the performance of components on the thin film transistor array substrate is improved, and the display quality of the panel is improved.

Various other objects, advantages and features of the present invention will become readily apparent from the ensuing detailed description, and the novel features will be particularly pointed out in the appended claims.

BRIEF DESCRIPTION OF FIGURES

The following detailed descriptions, given by way of example, and not intended to limit the present invention solely thereto, will be best be understood in conjunction with the accompanying figures.

DETAILED DESCRIPTION OF THE EMBODIMENTS

Figure 1A:
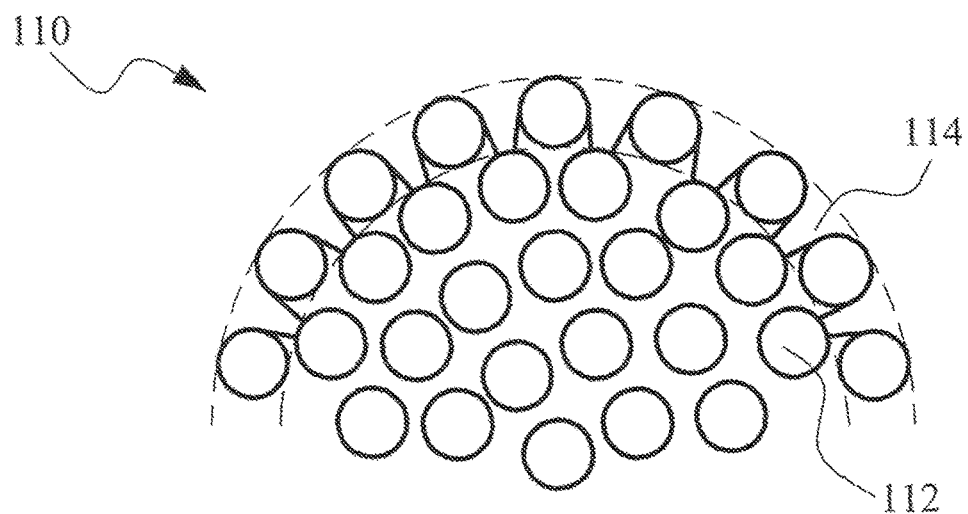
FIGS. 1A and 1B are schematic lattice ordered arrangement structure diagram showing the Nanocrystalline silicon germanium disposing on a surface of an active layer of a thin film transistor array substrate according to the present invention.

The following embodiments are referring to the accompanying drawings for exemplifying specific implementable embodiments of the present invention. Furthermore, directional terms described by the present invention, such as upper, lower, front, back, left, right, inner, outer, side and etc., are only directions by referring to the accompanying drawings, and thus the used directional terms are used to describe and understand the present invention, but the present invention is not limited thereto.

The drawings and description are to be regarded as illustrative in nature and not restrictive. Like reference numerals designate like elements throughout the specification. In addition, the size and thickness of each component shown in the drawings are arbitrarily shown for understanding and ease of description, but the present invention is not limited thereto.

In the drawings, the thickness of layers, films, panels, regions, etc., are exaggerated for clarity. In the drawings, for understanding and ease of description, the thicknesses of some layers and areas are exaggerated. It will be understood that, when an element such as a layer, film, region, or substrate is referred to as being "on" another element, it can be directly on the other element or intervening elements may also be present.

Furthermore, in the specification, "on" implies being positioned above or below a target element and does not imply being necessarily positioned on the top on the basis of a gravity direction.

For further explaining the technical means and efficacy of the present invention, the thin film transistor array substrate and display panel thereof including the embodiments, structures, features and effects thereof according to the present invention will be apparent from the following detailed description and accompanying drawings.

Figure 1B:
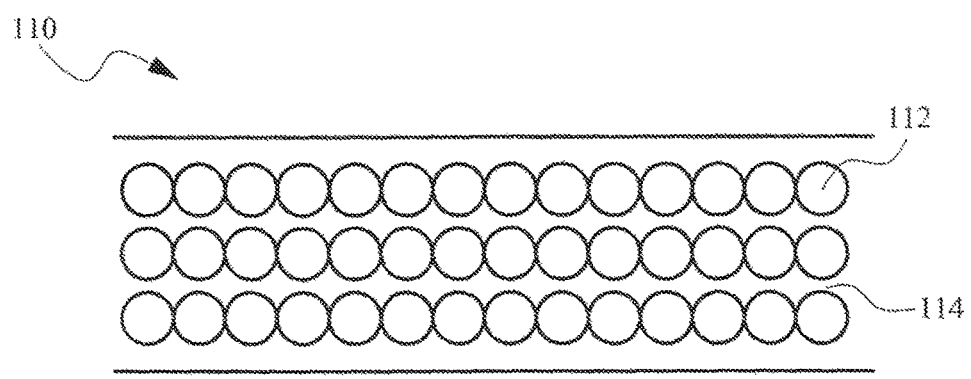

Referring to FIGS. 1A and 1B, FIGS. 1A and 1B are schematic lattice ordered arrangement structure diagram showing the nanocrystalline silicon germanium disposing on a surface of an active layer of a thin film transistor array substrate according to the present invention. In general, an active layer of a thin film transistor is made by amorphous silicon (a-Si) material, its advantage is small crystal grain but accompanied with the disadvantages in unstable crystal structure and low carrier mobility, generally lower than 1 cm2/V·s. By contrast, using polycrystalline silicon (poly-Si) as the material having the advantages of stable crystal structure and higher carrier mobility, it may be higher to 200 cm2/V·s, but having the disadvantage of oversize grain. Thus, the present invention utilizes the predetermined grain size of nanocrystalline silicon germanium oxide (NC-SixGeyOz) doped into the surface of the active layer.

Comparing with the amorphous silicon (a-Si), the nanocrystalline silicon germanium oxide (NC-SixGeyOz) has a higher carrier mobility about 2-3 cm2/V·s. Comparing with the polycrystalline silicon (poly-Si), and the grain size of nanocrystalline silicon germanium oxide is much smaller, about 1-20 nanometers. As shown in FIG. 1A, the nanocrystalline silicon germanium oxide (NC-SixGeyOz) comprises tightly and orderly arranged Nano-Si matrix 110. Each of the nanocrystalline silicon germanium crystals 112 is regular arranged and having stable crystal structure. Moreover, each layer of nano-silicon cluster (Si-nanocluster) can be effectively separated by the silicon dioxide wall (Silica wall) 114 and further to form the nanocrystalline silicon (Nano-Si matrix) 110, as shown in FIG. 1B, on the surface of the active layer. With this configuration, the resistance with very small gate electrode current can be provided, and the upward diffusion of the germanium (Ge) can be effectively blocked during the heat treatment process. Therefore, to enhance the performance of the components of the thin film transistor array substrate, and the performance of the display panel having the thin film transistor array substrate.

Figure 2:
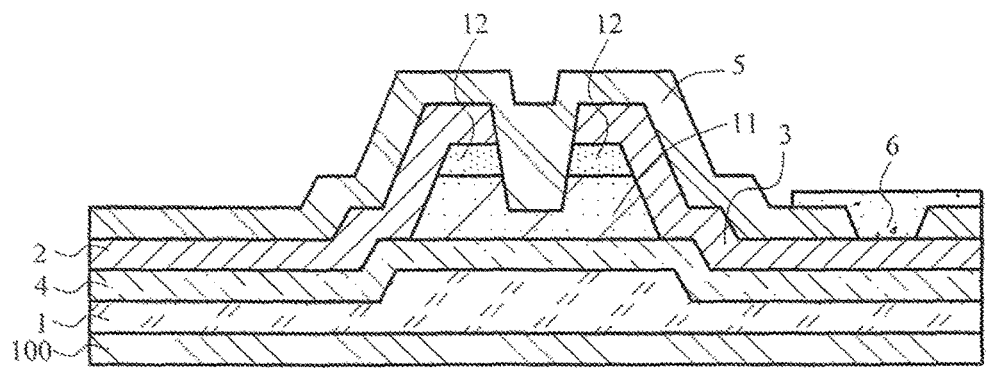
FIGS. 2 and 3 are schematic structural diagram showing a thin film transistor array substrate fabricated by five photomask processes according to the present invention.
Figure 3:
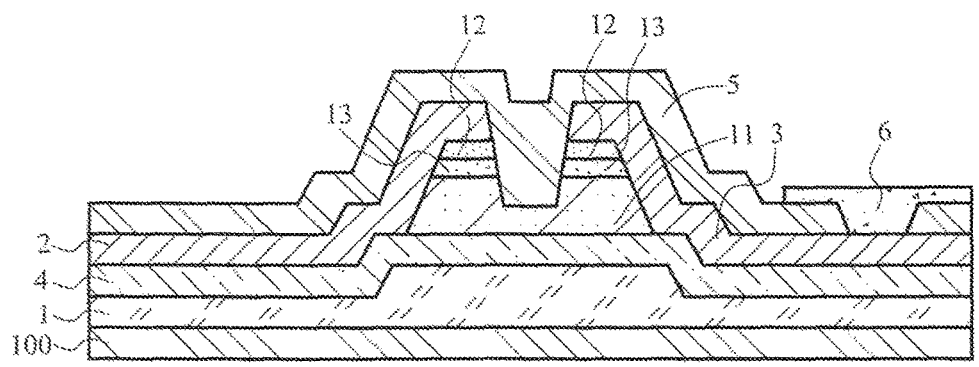

Referring to FIGS. 2 and 3, FIGS. 2 and 3 are schematic structural diagram showing a thin film transistor array substrate fabricated by five photomask processes according to an embodiment of the present invention. As shown in FIG. 2, in an embodiment, a thin film transistor array substrate comprises a substrate 100, a plurality of the thin film transistors disposed on the substrate 100. Wherein, each of the plurality of the thin film transistors comprises: a gate electrode structure 1; an isolate protective layer 4 disposed on the gate electrode structure 1 to isolate and protect the gate electrode structure 1; an active layer 11 disposed on the isolate protective layer 4 and having a plurality of the nanocrystalline silicon germanium oxide (NC-SixGeyOz) doped into the surface of the active layer 11; a source electrode layer 2 disposed on a side of the active layer 11 and forming an ohmic contact with the active layer 11; a drain electrode layer 3 disposed on other side of the active layer 11 and forming an ohmic contact with the active layer 11; a first concentration doping layer 12 disposed on the active layer 11 and between the source electrode layer 2 and the drain electrode layer 3; a passivation layer 5 covered onto the active layer 11, the source electrode layer 2 and the drain electrode layer 3 and configured for isolating and protecting; and a pixel electrode layer 6, such as indium tin oxide (ITO), covered onto the passivation layer 5 and the drain electrode layer 3, and configured for electrical conducting each components.

In order to form an effective ohmic between the source electrode layer 2 and the drain electrode layer 3, the present embodiment using a doping material including elements such as phosphorus (P), arsenic (As), stibium (Sb), or the like, implanted into the upper surfaces of the left and right sides of the active layer 11 to form a first concentration doping layer 12 having a high doping concentration. The first concentration doping layer 12 of the present embodiment is an N+ type doping layer. Through the implanting process and the subsequent disposing processes of metal layers, an effective ohmic contact, and a source electrode layer 2 and a drain electrode layer 3 are made. When the current on the source electrode layer 2 in the left side flowing to the drain electrode layer 3 in the right side, a channel of the active layer (not shown) formed in the middle of the active layer 11 is required to penetrate through. Thereby, when the driving voltage is applied to the gate electrode layer 1 under the active layer 11, an induced electric field is generated from the active layer 11 and controlling the channel of the active layer to be turned on, then, the current of the source electrode layer 2 can be circulated to the drain electrode layer 3, and then flowing to an ITO pixel electrode layer 6 having connected with the drain electrode layer 3. Taking the liquid crystal display panel as an example, the liquid crystal molecules in the liquid crystal display panel can be driven to rotate by the aforementioned controlling structure and method thereof. In the present embodiment, the material of the passivation layer 5 can be silicon nitride or silicon oxide, for example.

As shown in FIG. 3, the difference comparing with the FIG. 2 is the thin film transistor substrate of the present embodiment further comprising a second concentration doping layer 13 disposed between the first concentration doping layer 12 and the active layer 11. In the present embodiment, the second concentration doping layer 13 is an N+ type doping layer and a concentration of the first concentration doping layer 12 is greater than a concentration of the second concentration doping layer 13. The second concentration doping layer 13 and the first concentration doping layer 12 form a structure of two doping layers composed of the N− type doping layer and the N+ type doping layer. Since the second concentration doping layer 13 has the effect of reducing leakage current, so that the carrier mobility of the active layer 11 of the thin film transistor array substrate can be effectively improved.

In the aforementioned embodiments, the present invention provides a structure of two doping layers forming above the active layer 11, and between the source electrode layer 2 and the drain electrode layer 3. Wherein, the structure of two doping layers comprises the first concentration doping layer 12 with N+ type ion impurities and the second concentration doping layer 13 with N− type ion impurities.

Figure 4:
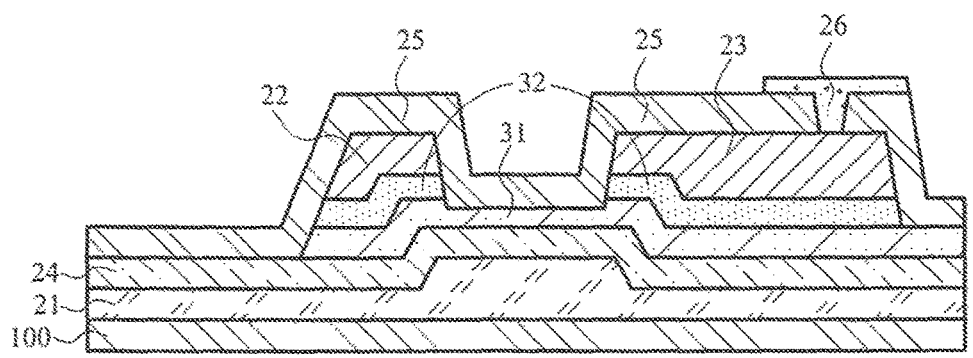
FIGS. 4-8 are schematic structural diagram showing a thin film transistor array substrate fabricated by five photomask processes according to the present invention.

Referring to FIGS. 4 to 8, FIGS. 4 to 8 are schematic structural diagram showing a thin film transistor array substrate fabricated by four photomask processes according to an embodiment of the present invention. As shown in FIG. 4, the difference among the present embodiment and the aforementioned embodiments is the thin film transistor substrate fabricated by four photomask processes.

In an embodiment, a thin film transistor array substrate comprises a substrate 100, a plurality of the thin film transistors disposed on the substrate 100. Wherein, each of the plurality of the thin film transistors comprises: a gate electrode structure 21; an isolate protective layer 24 disposed on the gate electrode structure 21 to isolate and protect the gate electrode structure 21; an active layer 31 disposed on the isolate protective layer 24 and having a plurality of the nanocrystalline silicon germanium oxide (NC-SixGeyOz) doped into the surface of the active layer 31; a source electrode layer 22 disposed on a side of the active layer 31 and forming an ohmic contact with the active layer 31; a drain electrode layer 23 disposed on other side of the active layer 31 and forming an ohmic contact with the active layer 31; a first concentration doping layer 32 disposed on the active layer 31 and between the source electrode layer 22 and the drain electrode layer 23; a passivation layer 25 covered onto the isolate protective layer 24, the source electrode layer 22 and the drain electrode layer 23 and configured for isolating and protecting; and a pixel electrode layer 6, such as indium tin oxide (ITO) 26, covered onto the passivation layer 25 and the drain electrode layer 23. Wherein, the active layer formed among the isolate protective layer 24, the passivation layer 25, the source electrode layer 22 and the drain electrode layer 23.

In the present embodiment, implanting a doping material including elements such as phosphorus (P), arsenic (As), stibium (Sb), or the like, into the upper surfaces of the left and right sides of the active layer 31 to form a high doping concentration. Moreover, the material of the passivation layer 5 can be silicon nitride or silicon oxide, for example.

Figure 5:
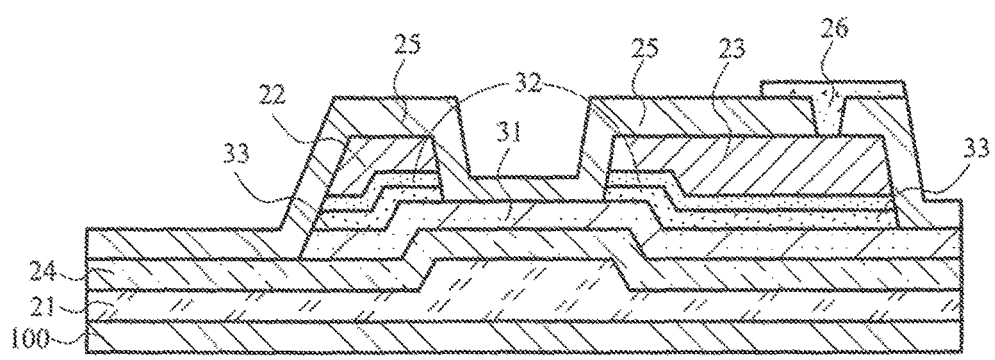

As shown in FIG. 5, the difference comparing with the FIG. 4 is the thin film transistor substrate of the present embodiment further comprising a second concentration doping layer 33 disposed between the first concentration doping layer 32 and the active layer 31. In the present embodiment, the second concentration doping layer 33 is an N− type doping layer and a concentration of the first concentration doping layer 32 is greater than a concentration of the second concentration doping layer 33. The second concentration doping layer 13 and the first concentration doping layer 12 form a structure of two doping layers composed of the N− type doping layer and the N+ type doping layer. Since the second concentration doping layer 33 with the N− type doping layer has the effect of reducing leakage current, so that the carrier mobility of the active layer 31 of the thin film transistor array substrate can be effectively improved.

Figure 6:
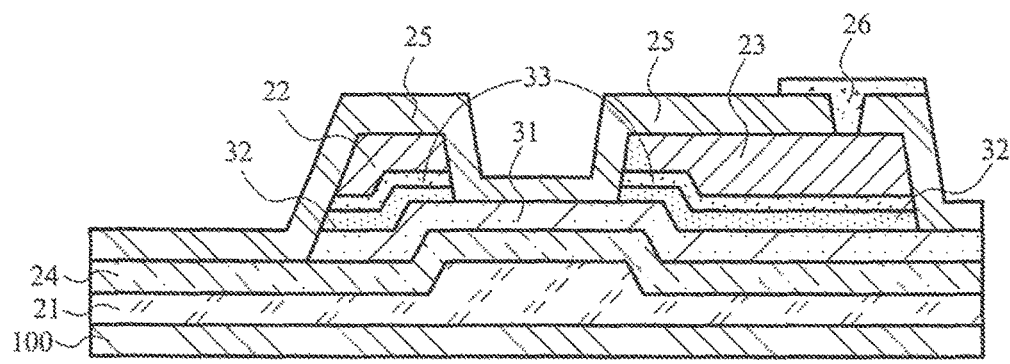

As shown in FIG. 6, the difference comparing with the FIG. 5 is the thin film transistor substrate of the present embodiment further comprising a second concentration doping layer 33 disposed on the first concentration doping layer 32 and forming between the source electrode layer 22 and the drain electrode layer 23. In the present embodiment, the second concentration doping layer 33 is an N− type doping layer and a concentration of the first concentration doping layer 32 is greater than a concentration of the second concentration doping layer 33. The second concentration doping layer 33 and the first concentration doping layer 32 forming a structure of two doping layers composed of the N+ type doping layer and the N− type doping layer. Since the second concentration doping layer 33 with the N− type doping layer has the effect of reducing leakage current, so that the carrier mobility of the active layer 31 of the thin film transistor array substrate can be effectively improved.

In the aforementioned embodiments, the present invention provides a structure of two doping layers forming above the active layer 31, and between the source electrode layer 22 and the drain electrode layer 23. Wherein, the structure of two doping layers is a stacked structure of the second concentration doping layer 33 and the first concentration doping layer 32.

Figure 7:
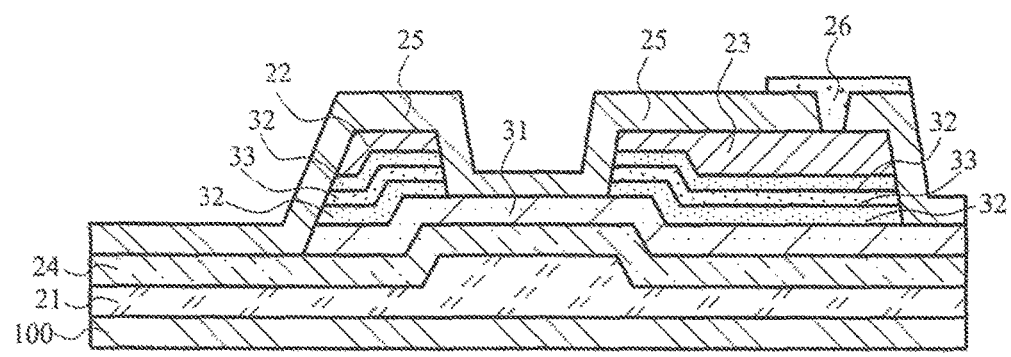

As shown in FIG. 7, the difference comparing with the FIG. 6 is the thin film transistor substrate of the present embodiment further comprising a first concentration doping layer 32 disposed on the second concentration doping layer 33 and forming between the source electrode 22 and the drain electrode layer 23. In the present embodiment, the first concentration doping layer 32 is an N+ type doping layer and a concentration of the first concentration doping layer 32 is greater than a concentration of the second concentration doping layer 33. The first concentration doping layer 32 and the second concentration doping layer 33 forming a structure composed of the N+ type doping layer, the N− type doping layer and the N+ type doping layer. Since the second concentration doping layer 33 with the N− type doping layer has the effect of reducing leakage current, so that the carrier mobility of the active layer 31 of the thin film transistor array substrate can be effectively improved.

Figure 8:
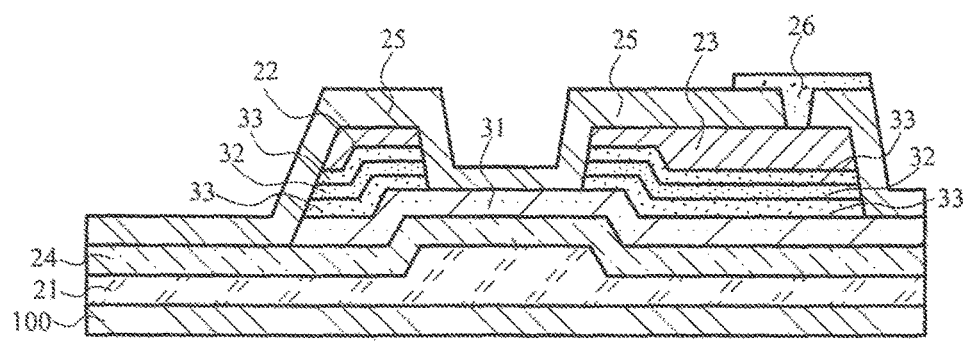

As shown in FIG. 8, the difference comparing with the FIG. 5 is the thin film transistor substrate of the present embodiment further comprising a second concentration doping layer 33 disposed on the first concentration doping layer 32 and forming between the source electrode 22 and the drain electrode layer 23.

In the present embodiment, the second concentration doping layer 33 is an N− type doping layer and a concentration of the first concentration doping layer 32 is greater than a concentration of the second concentration doping layer 33. The second concentration doping layer 33 and the first concentration doping layer 32 form a structure composed of the N− type doping layer, the N+ type doping layer and the N− type doping layer. Since the second concentration doping layer 33 with the N− type doping layer has the effect of reducing leakage current, so that the carrier mobility of the active layer 31 of the thin film transistor array substrate can be effectively improved.

In the aforementioned embodiments, the present invention provides a structure of three doping layers forming above the active layer 31 and between the source electrode layer 22 and the drain electrode layer 23. Wherein, the structure of three doping layers comprises the first concentration doping layer 32, the second concentration doping layer 33 and the first concentration doping layer 32. Alternative structure of three doping layers is stacked the second concentration doping layer 33, the first concentration doping layer 32 and the second concentration doping layer 33.

In the present embodiment, the second concentration doping layer 33 is an N− type doping layer and a concentration of the first concentration doping layer 32 is greater than a concentration of the second concentration doping layer 33.

Referring to FIGS. 1 to 8, in an embodiment, the present invention provides a display panel comprising a color filter substrate and the aforementioned thin film transistor array substrate. Wherein, one of the color filter substrate and the thin film transistor array substrate having a color filter layer.

According to the aforementioned embodiments, the thin film transistor array substrate having a plurality of the nanocrystalline silicon germanium oxide (NC-SixGeyOz) doped into the surface of the active layer 11, 31, so that the carrier mobility of the active layer 11, 31 can be effectively improved. In addition, by doping the lower concentration of the second concentration doping layer 13, 33 into the thin film transistor such that the leakage current of the thin film transistor array substrate is effective reduced. Therefore, the performance of components on the thin film transistor array substrate is improved, and the display quality of the panel is improved.

In some embodiments, the display panel may be, for example, a liquid crystal display panel, and is not limited thereto, and may be an OLED display panel, a W-OLED display panel, a QLED display panel, a plasma display panel, a curved display panel or other types of display panels.

In addition, in the specification, unless explicitly described to the contrary, the word "comprise" and variations such as "comprises" or "comprising" will be understood to imply the inclusion of stated elements but not the exclusion of any other elements.

The present invention has been described with a preferred embodiment thereof and it is understood that many changes and modifications to the described embodiment can be carried out without departing from the scope and the spirit of the invention that is intended to be limited only by the appended claims.

What is claimed is:

1. A thin film transistor array substrate, comprising:
   a substrate;
   a plurality of thin film transistors disposed on the substrate, wherein each of the plurality of thin film transistors comprises:
   a gate electrode structure;
   an isolate protective layer, disposed on the gate electrode structure;
   an active layer, disposed on the isolate protective layer, wherein the active layer is doped with a silicon-germanium oxide having the nanocrystalline size in a range of 1 nanometer to 20 nanometers;
   a source electrode layer, disposed on a side of the active layer and forming an ohmic contact with the active layer;
   a drain electrode layer, disposed on other side of the active layer and forming an ohmic contact with the active layer;
   a first concentration doping layer, disposed on the active layer and between the source electrode layer and the drain electrode layer;
   a passivation layer, covered onto the active layer, the source electrode layer and the drain electrode layer; and
   a pixel electrode layer, covered onto the passivation layer and the drain electrode layer.

2. The thin film transistor array substrate according to claim 1, further comprising a second concentration doping layer disposed between the first concentration doping layer and the active layer, wherein a concentration of the first concentration doping layer is greater than a concentration of the second concentration doping layer.

3. A thin film transistor array substrate, comprising:
   a substrate;
   a plurality of thin film transistors disposed on the substrate, wherein each of the plurality of thin film transistors comprises:
   a gate electrode structure;
   an isolate protective layer, disposed on the gate electrode structure;

an active layer, disposed on the isolate protective layer, wherein the active layer is doped with a silicon-germanium oxide;

a source electrode layer, disposed on a side of the active layer and forming an ohmic contact with the active layer;

a drain electrode layer, disposed on other side of the active layer and forming an ohmic contact with the active layer;

a plurality of doping layers, disposed on the active layer and between the source electrode layer and the drain electrode layer;

a passivation layer, covered onto the isolate protective layer, the source electrode layer and the drain electrode layer; and a pixel electrode layer, covered onto the passivation layer and the drain electrode layer;

wherein, the plurality of the doping layers comprises a first concentration doping layer and a second concentration doping layer, and polarities of the adjacent doping layers are different;

wherein, the active layer is disposed among the isolate protective layer, the passivation layer, the source electrode layer, and the drain electrode layer.

4. The thin film transistor array substrate according to claim 3, wherein the silicon-germanium oxide is composed of the nanocrystalline size in a range of 1 nanometer to 20 nanometers.

5. The thin film transistor array substrate according to claim 3, wherein a material of the passivation layer is silicon nitride.

6. The thin film transistor array substrate according to claim 3, wherein a material of the passivation layer is silicon oxide.

7. The thin film transistor array substrate according to claim 3, wherein the plurality of doping layers are a two doping layers structure.

8. The thin film transistor array substrate according to claim 7, wherein each of the plurality of doping layers comprises a stacked structure of the second concentration doping layer and the first concentration doping layer stacked up, wherein a concentration of the first concentration doping layer is greater than a concentration of the second concentration layer.

9. The thin film transistor array substrate according to claim 3, wherein the plurality of doping layers are a three doping layers structure.

10. The thin film transistor array substrate according to claim 9, wherein each of the plurality of doping layers comprises a stacked structure of the first concentration doping layer, the second concentration doping layer and the first concentration doping layer, wherein a concentration of the first concentration doping layer is greater than a concentration of the second concentration layer.

11. The thin film transistor array substrate according to claim 9, wherein each of the plurality of doping layers comprises a stacked structure of the second concentration doping layer, the first concentration doping layer and the second concentration doping layer, wherein a concentration of the first concentration doping layer is greater than a concentration of the second concentration layer.

12. A display panel, comprising:
a color filter substrate; and
a thin film transistor array substrate, comprising:

a substrate;

a plurality of thin film transistors disposed on the substrate, wherein each of the plurality of thin film transistors comprises:

a gate electrode structure;

an isolate protective layer, disposed on the gate electrode structure;

an active layer, disposed on the isolate protective layer, wherein the active layer is doped with a silicon-germanium oxide;

a source electrode layer, disposed on a side of the active layer and forming an ohmic contact with the active layer;

a drain electrode layer, disposed on other side of the active layer and forming an ohmic contact with the active layer;

a plurality of doping layers, disposed on the active layer and between the source electrode layer and the drain electrode layer;

a passivation layer, covered onto the isolate protective layer, the source electrode layer and the drain electrode layer; and a pixel electrode layer, covered onto the passivation layer and the drain electrode layer;

wherein, each of the plurality of the doping layers comprises a first concentration doping layer and a second concentration doping layer, and polarities of the adjacent doping layers are different;

wherein, the active layer is disposed among the isolate protective layer, the passivation layer, the source electrode layer, and the drain electrode layer.

13. The display panel according to claim 12, wherein the silicon-germanium oxide is composed of a nanocrystalline size in a range of 1 nanometer to 20 nanometers.

14. The display panel according to claim 12, wherein a material of the passivation layer is silicon nitride.

15. The display panel according to claim 12, wherein a material of the passivation layer is silicon oxide.

16. The display panel according to claim 12, wherein the plurality of doping layers are a two doping layers structure.

17. The display panel according to claim 16, wherein each of the plurality of doping layers comprises a stacked structure of the second concentration doping layer and the first concentration doping layer, wherein a concentration of the first concentration doping layer is greater than a concentration of the second concentration layer.

18. The display panel according to claim 12, wherein the plurality of doping layers are a three doping layers structure.

19. The display panel according to claim 18, wherein each of the plurality of doping layers comprises a stacked structure of the first concentration doping layer, the second concentration doping layer and the first concentration doping layer, wherein a concentration of the first concentration doping layer is greater than a concentration of the second concentration layer.

20. The display panel according to claim 18, wherein each of the plurality of doping layers comprises a stacked structure of the second concentration doping layer, the first concentration doping layer and the second concentration doping layer, wherein a concentration of the first concentration doping layer is greater than a concentration of the second concentration layer.

* * * * *